(12) United States Patent
Tokuhara

(10) Patent No.: US 7,055,391 B2
(45) Date of Patent: Jun. 6, 2006

(54) PRESSURE SENSOR HAVING CASING WITH GROOVE

(75) Inventor: Minoru Tokuhara, Okazaki (JP)

(73) Assignee: Denso Corporation, Kariya (JP)

( * ) Notice: Subject to any disclaimer, the term of this patent is extended or adjusted under 35 U.S.C. 154(b) by 71 days.

(21) Appl. No.: 10/791,859

(22) Filed: Mar. 4, 2004

(65) Prior Publication Data

US 2004/0177697 A1 Sep. 16, 2004

(30) Foreign Application Priority Data

Mar. 13, 2003 (JP) .............................. 2003-067960

(51) Int. Cl.
*G01L 7/00* (2006.01)

(52) U.S. Cl. ..................................................... 73/700

(58) Field of Classification Search ................. 73/700, 73/715, 753, 754; 96/421
See application file for complete search history.

(56) References Cited

U.S. PATENT DOCUMENTS

| | | | |
|---|---|---|---|
| 4,231,365 A | 11/1980 | Scarberry | |
| 4,329,983 A | 5/1982 | Fletcher | |
| 4,632,112 A | 12/1986 | Matthews | |
| 4,688,568 A | 8/1987 | Frass et al. | |
| 4,793,327 A | 12/1988 | Frankel | |
| 4,825,858 A | 5/1989 | Frankel | |
| 5,339,805 A | 8/1994 | Parker | |
| 5,499,625 A | 3/1996 | Frass et al. | |
| 5,919,183 A | 7/1999 | Field | |
| 6,053,166 A | 4/2000 | Gomez | |
| 6,439,232 B1 | 8/2002 | Brain | |
| 6,568,388 B1 | 5/2003 | Christopher | |
| 6,637,435 B1 | 10/2003 | Ciagllia et al. | |
| 6,651,508 B1 * | 11/2003 | Baba et al. | 73/754 |
| 6,694,818 B1 * | 2/2004 | Chikuan et al. | 73/715 |
| 6,718,829 B1 * | 4/2004 | Baba et al. | 73/754 |
| 2002/0050052 A1 * | 5/2002 | Tokuhara et al. | 29/595 |
| 2002/0062698 A1 * | 5/2002 | Baba et al. | 73/754 |
| 2002/0112610 A1 * | 8/2002 | Baba et al. | 96/421 |
| 2002/0190865 A1 * | 12/2002 | Horibe et al. | 340/611 |
| 2002/0195103 A1 | 12/2002 | O'Mara | |
| 2003/0062039 A1 | 4/2003 | Sniadach | |
| 2004/0187587 A1 * | 9/2004 | Baba et al. | 73/715 |
| 2005/0109113 A1 * | 5/2005 | Baba | 73/700 |

FOREIGN PATENT DOCUMENTS

| | | |
|---|---|---|
| JP | U-H01-137416 | 9/1989 |
| JP | A-H10-206256 | 8/1998 |
| JP | A-2000-46673 | 2/2000 |
| JP | A-2001-74581 | 3/2001 |
| JP | A-2001-281086 | 10/2001 |
| JP | A-2002-162309 | 6/2002 |

* cited by examiner

*Primary Examiner*—Max Noori
*Assistant Examiner*—Andre Allen
(74) *Attorney, Agent, or Firm*—Posz Law Group, PLC

(57) ABSTRACT

A pressure sensor includes a sensor chip for detecting pressure; a casing for accommodating the sensor chip; and an atmosphere introduction port for introducing an atmosphere pressure as a reference pressure into the sensor chip. The atmosphere introduction port is disposed on the casing. The casing includes a groove for discharging a water drop adhering around the atmosphere introduction port to an outside of the casing. The sensor without any filter can prevent the water drop from penetrating into the atmosphere introduction port.

15 Claims, 7 Drawing Sheets

PRESSURE SENSOR HAVING CASING WITH GROOVE

CROSS REFERENCE TO RELATED APPLICATION

This application is based on Japanese Patent Application No. 2003-67960 filed on Mar. 13, 2003, the disclosure of which is incorporated herein by reference.

FIELD OF THE INVENTION

The present invention relates to a pressure sensor having a casing with a groove.

BACKGROUND OF THE INVENTION

A pressure sensor includes a sensor chip, a casing and an atmosphere introduction port. The sensor chip for detecting pressure is accommodated in the casing. The atmosphere pressure around the sensor is introduced into the casing through the atmosphere introduction port so that the sensor chip detects the objective pressure. The atmosphere introduction port is disposed on the casing. This type of pressure sensor is disclosed, for example, in Japanese Unexamined Patent Application Publications No. 2000-46673 and No. 2001-281086.

In general, in the sensor, the introduced atmosphere pressure is applied as a reference pressure to one side of the sensor chip. The objective pressure as a measuring object is applied to the other side of the sensor chip. Therefore, the sensor chip detects a difference between the reference pressure and the objective pressure so that the sensor detects the object pressure relatively. Thus, the sensor provides a relative pressure sensor.

The atmosphere introduction port includes a filter disposed on an outer opening of the port. The filter is made of, for example, goatex and the like. The goatex is produced by Japan Goatex Co., LTD under the trade name of GOATEX. The filter passes only gas without passing moisture, so that the filter prevents water drop such as rainwater from penetrating into the casing through the atmosphere introduction port. However, it is necessary to use special techniques such as a supersonic adhesion method and special material such as goatex with a special adhesive film. Therefore, a manufacturing cost of the sensor is increased.

SUMMARY OF THE INVENTION

In view of the above-mentioned problems, it is an object of the present invention to provide a pressure sensor having a casing with a groove. Specifically, the groove prevents water drop from penetrating into the sensor, and a manufacturing cost of the sensor is small.

A pressure sensor includes a sensor chip for detecting pressure; a casing for accommodating the sensor chip; and an atmosphere introduction port for introducing an atmosphere pressure as a reference pressure into the sensor chip. The atmosphere introduction port is disposed on the casing. The casing includes a groove for discharging a water drop adhering around the atmosphere introduction port to an outside of the casing.

The above sensor without any filter can prevent the water drop from penetrating into the atmosphere introduction port. Specifically, the groove prevents the water drop from penetrating into the sensor, and a manufacturing cost of the sensor is small.

Preferably, the casing further includes a chamber for accommodating the sensor chip. The casing has a casing top, which faces atmosphere, and the atmosphere introduction port connect between the casing top and the chamber so that the atmosphere pressure is introduced into the chamber through the atmosphere introduction port. More preferably, the casing top includes a periphery and a concavity having a bottom. The periphery of the casing top surrounds the concavity of the casing top. The atmosphere introduction port has an outer opening on the bottom of the concavity. The groove is disposed on the periphery of the casing top. Furthermore preferably, the periphery of the casing top is higher than the bottom of the concavity, and the periphery includes a notch portion having a bottom so that the bottom of the notch portion and the bottom of the concavity provide a same plane so as to discharge the water drop disposed on the bottoms.

Further, preferably the groove includes a first and second ends, and the notch portion includes a first side and second side, and the first end of the groove is disposed on the first side of the notch portion, and the second end of the groove is disposed on the second side of the notch portion so that the groove surrounds the concavity of the casing top 13 except for the notch portion.

Furthermore, preferably, the water drop disposed on the periphery of the casing top is gathered into the groove so that the water drop is discharged from the groove through the notch portion to the outside of the sensor, and the water drop disposed on the bottom of the concavity is discharged from the notch portion to the outside of the sensor.

Furthermore, preferably, the bottom of the concavity is slanted so that the bottom disposed around the outer opening of the atmosphere introduction port is the highest.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1A:
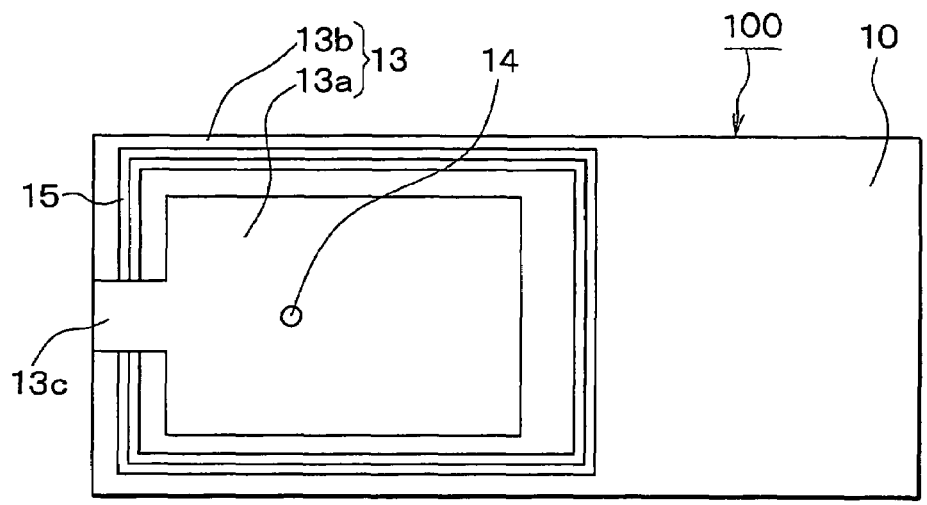
FIG. 1A is a plan view showing a pressure sensor.
Figure 1B:
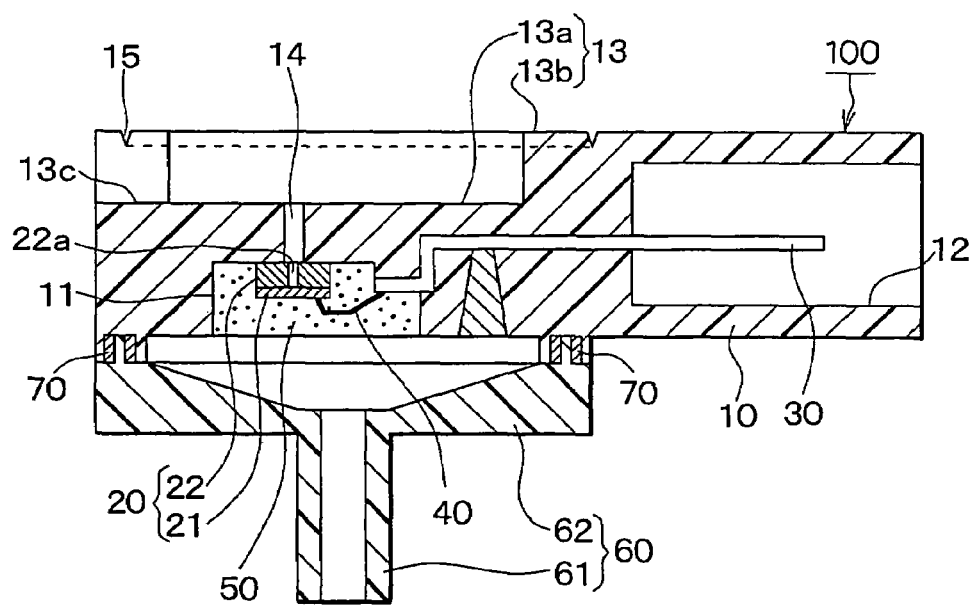
FIG. 1B is a cross sectional view showing the sensor according to a first embodiment of the present invention.

A pressure sensor 100 according to a first embodiment of the present invention is shown in FIGS. 1A and 1B. The pressure sensor 100, for example, is used for a vehicle. Specifically, the pressure sensor 100 is displaced in an engine compartment of the vehicle so that the pressure sensor 100 works as an intake manifold pressure sensor for detecting intake manifold pressure in an intake manifold of the vehicle.

The sensor 100 includes a casing 10 made of resin such as PPS (i.e., poly(phenylene sulfide)) or PBT (i.e., poly (butylene terephthalate)). The casing 10 includes a chamber 11 disposed under the casing 10. A sensor chip 20 is disposed in the chamber 11. The sensor chip 20 is provided such that a semiconductor substrate 21 is bonded to a glass base 22 by using an anodic bonding method and the like so as to integrate together. The semiconductor substrate 21 includes a strain gauge (not shown) for detecting pressure applied to the substrate 21. Thus, a pressure signal corresponding to the pressure applied to the substrate 21 is outputted. The glass base 22 includes a through hole 22a for introducing atmosphere pressure to the backside of the substrate 21.

The sensor chip 20 is bonded and fixed to the casing 10 through the glass base 22 by using adhesive such as epoxy resin material. The casing 10 further includes a lead needle 30. The lead needle 30 is formed by insert molding method and the like. One end of the lead needle 30 is disposed in the chamber 11 of the casing 10. The one end of the lead needle 30 is electrically connected to the substrate 21 with a bonding wire 40 such as gold wire or aluminum wire. Specifically, the lead needle 30 is connected to the surface of the substrate 21 of the sensor chip 20. The other end of the lead needle 30 is exposed in an opening 12 of the casing 10. The other end of the lead needle 30 is electrically connectable to an outer wire (not shown) so that the lead needle 30 together with the opening 12 of the casing 10 provides a connector for connecting to the outer wire.

The lead needle 30 is made of conductive metal such as copper or alloy-42 (i.e., Fe 58%/Ni 42%). The lead needle 30 is integrally formed together with the casing 10. Specifically, the lead needle 30 is put in a molding die of the casing 10 and then the lead needle 30 is molded with the casing 10. That is, the lead needle 30 is formed by the insert molding method.

A protection member 50 is filled in the chamber 11 of the casing 10 so that the sensor chip 20, a bonding wire 40 and a connection portion between the lead needle 30 and the bonding wire 40 are sealed with the protecting member 50. The protection member 50 is made of fluoro gel, silicone gel or the like. Each part such as the sensor chip 20 sealed with the protection member 50 is protected from the outside so that the part has highly water resistance and highly corrosion resistance. Specifically, the water resistance and the corrosion resistance of the part are improved so that the reliability of the part is improved.

A pipe 60 is attached to the bottom of the casing 10 so that the chamber 11 is covered with the pipe 60. The pipe 60 is also made of resin, which is the same material as the casing 10. The pipe 60 is bonded to the casing 10 with an adhesive 70 made of epoxy resin. The pipe 60 includes a cylinder portion 61 and a taper portion 62. The cylinder portion 61 has a cylindrical shape, and the taper portion 62 has a tapered cylindrical shape. The taper portion 62 works as an attachment to the casing 10. The cylinder portion 61 is, for example, connected to a hosepipe (not shown), which connects to the intake manifold of the vehicle, so that objective pressure is introduced into the sensor 100. Specifically, the intake manifold pressure is introduced into the sensor 100 through the hosepipe and the cylinder portion 61.

When the sensor 100 is mounted in the engine compartment of the vehicle, the pipe 60 of the sensor 100 faces the ground. That is, the pipe 60 turns downside of FIG. 1B. This arrangement achieves that water drop in fluid such as the intake air as a detection object is prevented from penetrating into the sensor 100. For example, even if the moisture penetrates into the sensor 100 through the pipe 60, the water drop flows on a tapered surface of the taper portion 62 and drops downward so that the water drop is discharged through the cylinder portion 61 to the outside of the sensor 100.

A concavity 13a is formed on the top of the casing 10, i.e., a casing top 13. The concavity 13a is disposed on a predetermined position corresponding to the sensor chip 20. Thus, the casing top 13 is composed of the concavity 13a and a periphery 13b of the casing 13. A certain step is formed between the concavity 13a and the periphery 13b. The casing top 13 faces the sky so that the casing top 13 exposes to the atmosphere. That is, the casing top 13 turns upward of FIG. 1B.

A part of the periphery 13b is notched so that a notch portion 13c is formed. Through the notch portion 13c, the concavity 13a extends to the outside periphery of the casing 10. An atmosphere introduction port 14 as a through hole is formed in the casing 10 so as to reach an accommodation space of the sensor chip 20. The atmosphere introduction port 14 is disposed between the chamber 11 of the casing 10 and the concavity 13a of the casing top 13 so that the bottom of the casing 10 and the casing top 13 are connected together with the atmosphere introduction port 14. The atmosphere introduction port 14 introduces the atmosphere pressure into the sensor chip 20. Specifically, the through hole 22a of the glass base 22 connects to the atmosphere introduction port 14 and an outer opening of the atmosphere introduction port 14 disposed on the outside of the casing 10, so that the atmosphere pressure is introduced into the through hole 22a of the glass base 22.

In the sensor 100, the atmosphere pressure is applied to the backside of the substrate 21, and the objective pressure such as the intake manifold pressure introduced from the pipe 60 is applied to the foreside of the substrate 21 through the protection member 50. In the sensor 100, the sensor chip 20 detects a difference between the atmosphere pressure as the reference pressure and the objective pressure so that the sensor chip 20 outputs a pressure signal corresponding to a relative pressure. The relative pressure is defined as the difference between the atmosphere pressure applied to the backside and the objective pressure applied to the foreside of the substrate 21. Then, the pressure signal outputs through the bonding wire 40 and the lead needle 30 to the outside circuit (not shown). Thus, the sensor 100 detects the objective pressure as the relative pressure.

Figure 2:
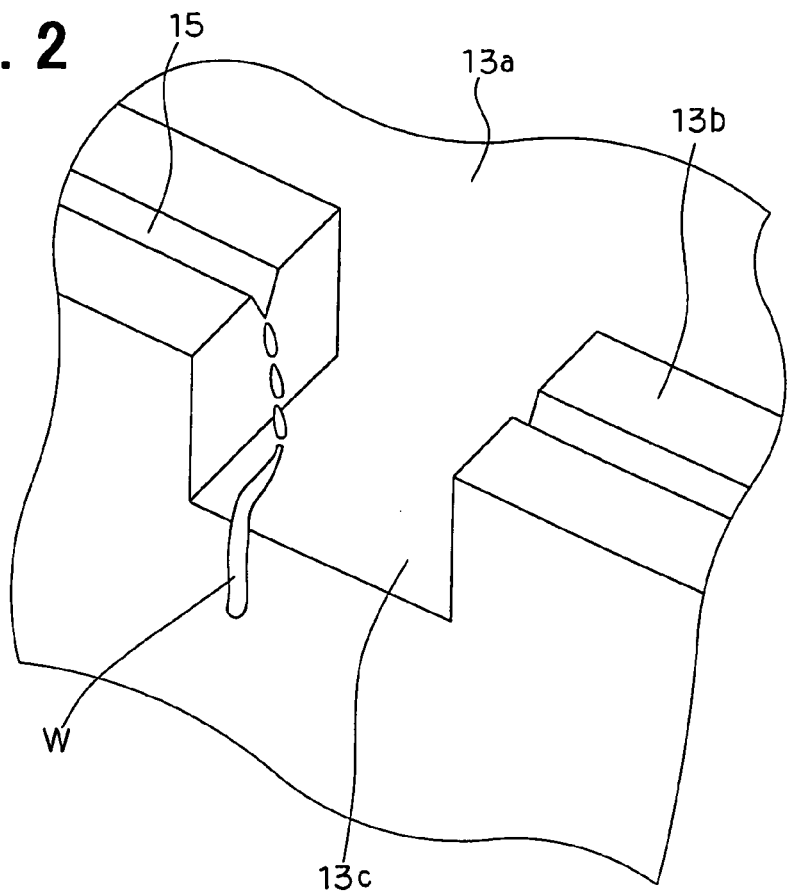
FIG. 2 is an enlarged perspective view showing a notch portion of the sensor according to the first embodiment.
Figure 3A:
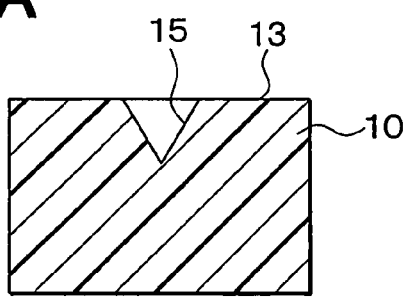
FIGS. 3A to 3C are cross sectional views showing a groove of the casing of the sensor according to the first embodiment.
Figure 3B:
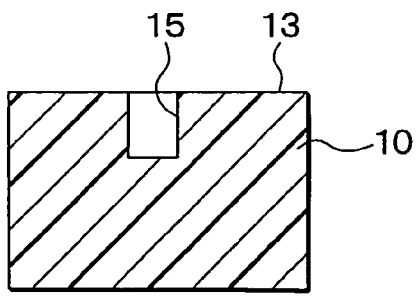
Figure 3C:
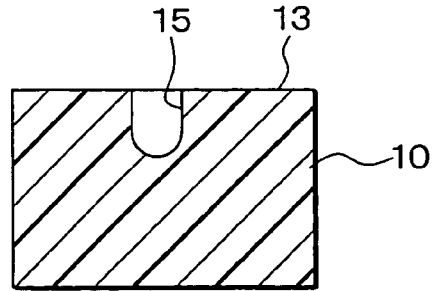

The sensor 100 is mainly characterized as follows. A groove 15 is formed on the casing top 13. Specifically, the groove 15 is disposed on the periphery 13b of the casing top 13. The groove 15 discharges a water drop W adhered on the casing top 13 to the outside of the casing 10, as shown in FIG. 2. One end of the groove 15 is disposed on one side of the notch portion 13c, and the other end of the groove 15 is disposed on the other side of the notch portion 13c so that the groove 15 surrounds the concavity 13a of the casing top 13. Thus, the groove 15 has a ring shape, and has a V-shaped cross section. Although the groove 15 has the V-shaped cross section, the groove 15 can have another cross section such as a square cross section and a U-shaped cross section, as shown in FIGS. 3A–3C. The groove 15 has a predetermined depth and width, which are determined such that the water drop W disposed in the groove 15 is movable by capillary phenomenon. The groove 15 is easily formed together with the casing 10 by preparing the V-shaped portion corresponding to the groove 15 in a molding die of the casing 10.

Thus, even if the water drop W such as rain water, moisture in the atmosphere and washer fluid in the engine compartment is adhered to the casing top 13, i.e., the periphery 13b of the casing top 13, the water drop W is discharged through the groove 15 to the outside of the casing 10. Specifically, the water drop w moves in the groove 15 by the capillary phenomenon toward the end of the groove 15, and then the water drop W is discharged to the outside of the casing 10 from the notch portion 13c of the casing top 13.

Thus, the sensor 100 without any filter disposed on the atmosphere introduction port 14 prevents the water drop W from penetrating into the atmosphere introduction port 14. Therefore, the sensor 100 having the sensor chip 20 accommodated in the casing 10 for detecting the pressure by introducing the atmosphere pressure as the reference pressure can prevent the water drop, i.e., the water drop W from penetrating into the atmosphere introduction port 14. Further, the sensor 100 can be manufactured at low cost. Specifically, the groove 15 prevents the water drop from penetrating into the sensor 100, and a manufacturing cost of the sensor 100 is small.

Second Embodiment

Figure 4A:
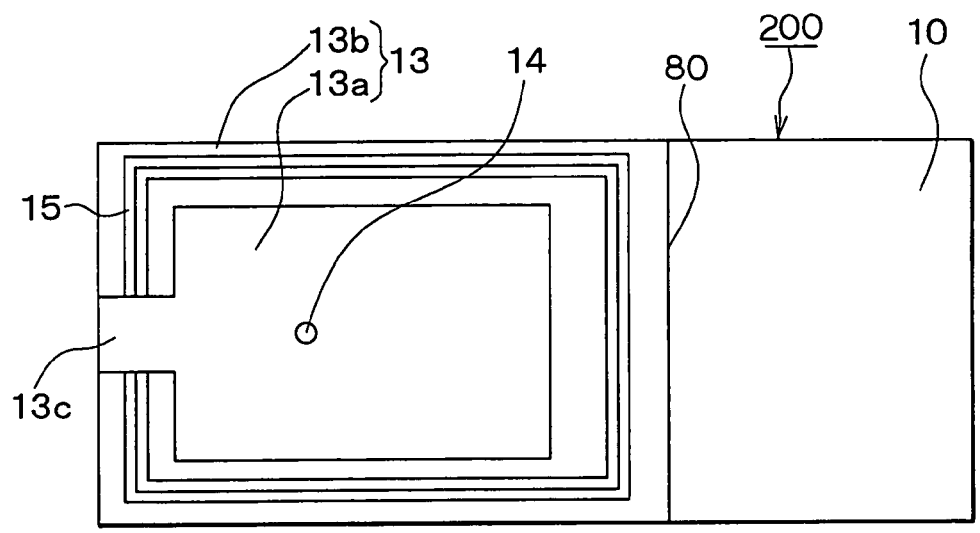
FIG. 4A is a plan view showing a pressure sensor.
Figure 4B:
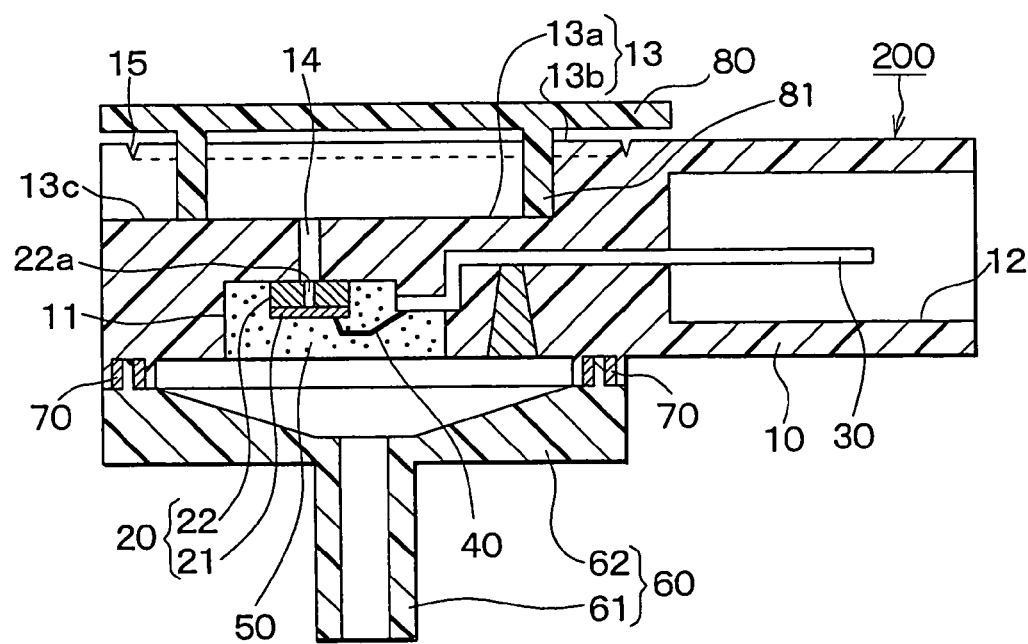
FIG. 4B is a cross sectional view showing the sensor according to a second embodiment of the present invention.

A pressure sensor 200 according to a second embodiment of the present invention is shown in FIGS. 4A and 4B. The sensor 200 includes a cover 80 for covering the atmosphere introduction port 14. The cover 80 is made of resin such as PPS or PBT. The cover 80 is attached and fixed to the casing top 13 by press fitting method and the like. Specifically, the cover 80 includes a convexity 81. The convexity 81 of the cover 80 just fits into the concavity 13a of the casing top 13, so that the cover 80 is press-inserted into the casing 10 by using the convexity 81.

The cover 80 blocks the water drop splashing toward the atmosphere introduction port 14 and jumping over the groove 15. Therefore, the water drop can be surely prevented from penetrating into the atmosphere introduction port 14.

BY contrary, if the sensor 200 has no cover 80, the water drop may penetrate into the atmosphere introduction port 14 in case of following situation. When the atmosphere temperature around the sensor 200 is high, the water drop adheres to the casing top 13 so as to cover the opening of the atmosphere introduction port 14. The temperature of the water drop is lower than that of the sensor 200, so that the high temperature air trapped in the atmosphere introduction port 14 is cooled by the water drop. Thus, the atmosphere introduction port 14 covered with the water drop has negative pressure, so that the water drop adhering to the opening of the atmosphere introduction port 14 is sucked into the atmosphere introduction port 14. Further, when the water drop has a diameter smaller than a diameter of the atmosphere introduction port 14, for example, smaller than $\phi 1$ mm, the water drop can directly penetrate into the atmosphere introduction port 14. Therefore, the cover 80 is necessitated to prevent the water drop from penetrating into the atmosphere introduction port 14.

Thus, the sensor 200 with the cover 80 disposed on the atmosphere introduction port 14 prevents the water drop from penetrating into the atmosphere introduction port 14.

Third Embodiment

Figure 5A:
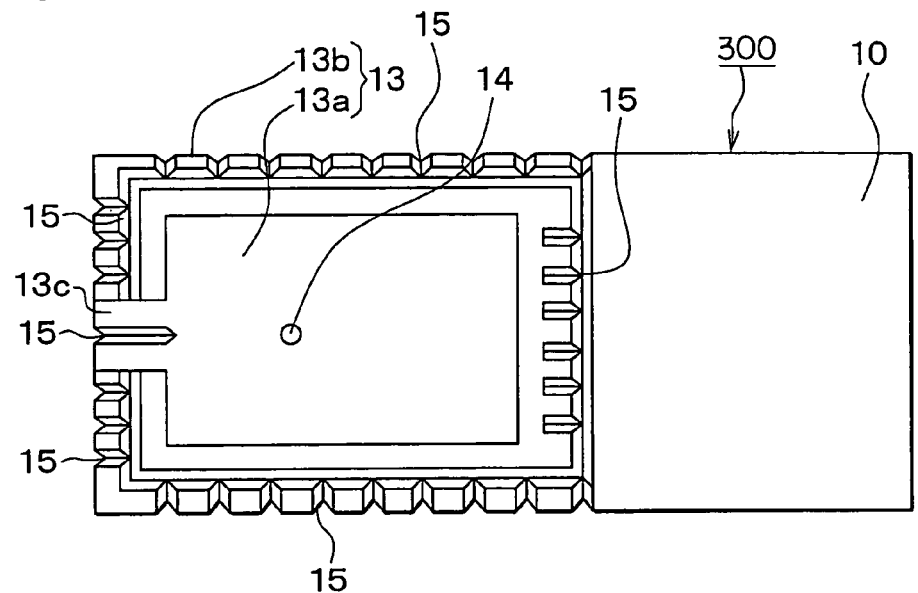
FIG. 5A is a plan view showing a pressure sensor.
Figure 5B:
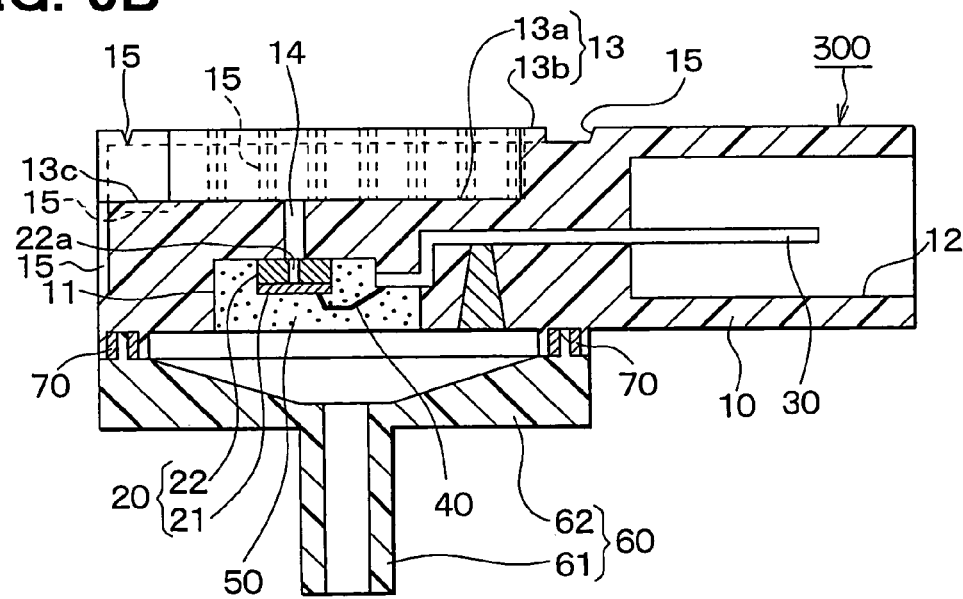
FIG. 5B is a cross sectional view showing the sensor according to a third embodiment of the present invention.
Figure 6:
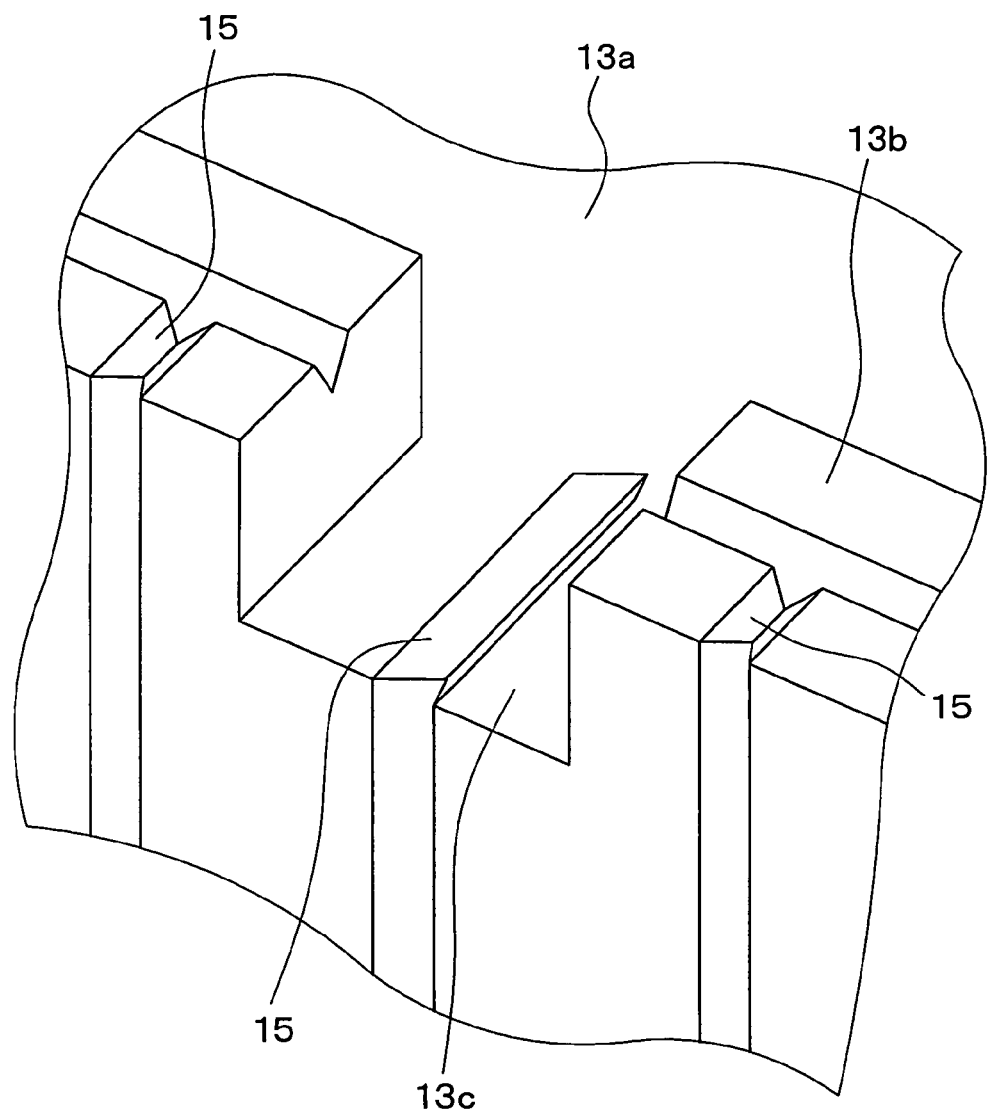
FIG. 6 is an enlarged perspective view showing a notch portion of the sensor according to the third embodiment.

A pressure sensor 300 according to a third embodiment of the present invention is shown in FIGS. 5A, 5B and 6. The sensor 300 includes multiple grooves 15, which are more than the groove 15 in the sensor 100 shown in FIGS. 1A and 1B. The multiple grooves 15 are formed on the periphery 13b of the casing top 13. Specifically, a part of the grooves 15 extend from a ring-shaped groove 15 surrounding the concavity 13a of the casing top 13 to the sidewall of the casing 10. Further, another part of the grooves 15 are formed on the sidewall of the casing 10, as shown in FIG. 6. Furthermore, further another groove 15 is formed on the notch portion 13c.

Thus, the sensor 300 with the multiple grooves 15 surely prevents the water drop from penetrating into the atmosphere introduction port 14.

Fourth Embodiment

Figure 7A:
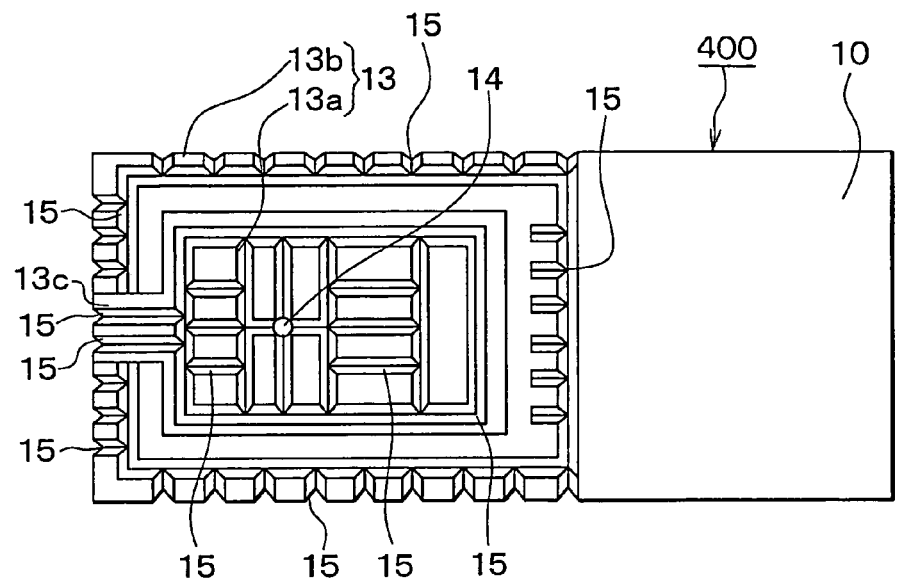
FIG. 7A is a plan view showing a pressure sensor.
Figure 7B:
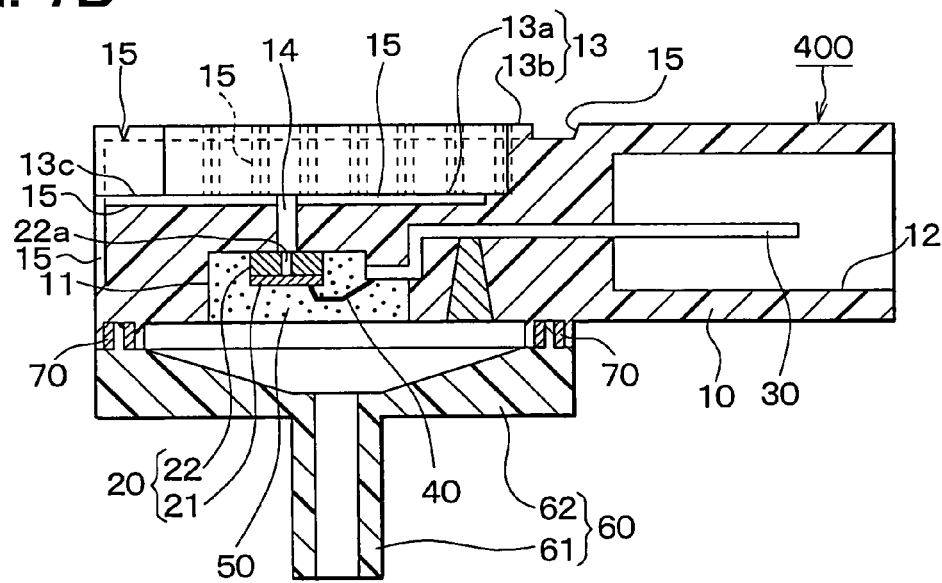
FIG. 7B is a cross sectional view showing the sensor according to a fourth embodiment of the present invention.

A pressure sensor 400 according to a fourth embodiment of the present invention is shown in FIGS. 7A, and 7B. The sensor 400 includes multiple grooves 15, which are more than the grooves 15 of the sensor 300 shown in FIGS. 5A and 5B. The grooves 15 are formed on the concavity 13a of the casing top 13 so that the grooves 15 are adjacent to the opening of the atmosphere introduction port 14. Therefore, the water drop adhering to the opening of the atmosphere introduction port 14 is discharged effectively to the outside of the casing 10.

Fifth Embodiment

Figure 8A:
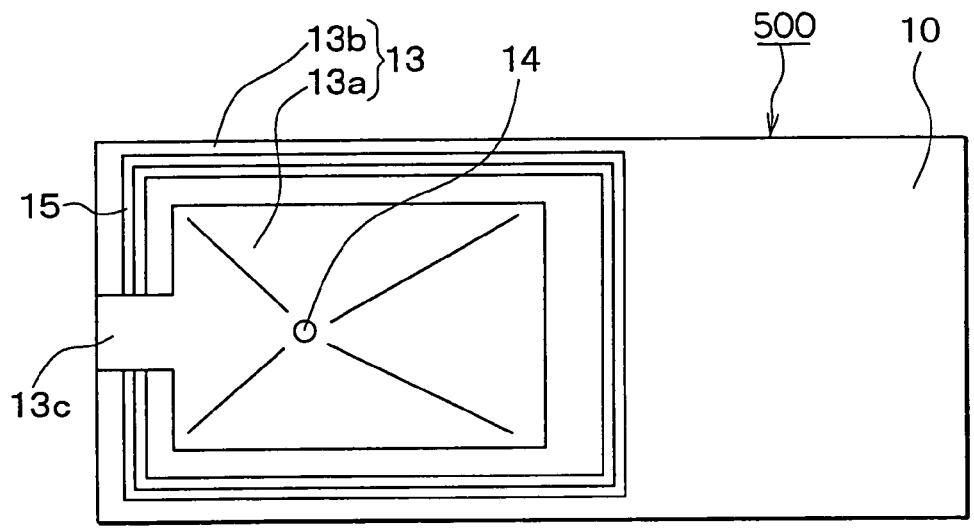
FIG. 8A is a plan view showing a pressure sensor.
Figure 8B:
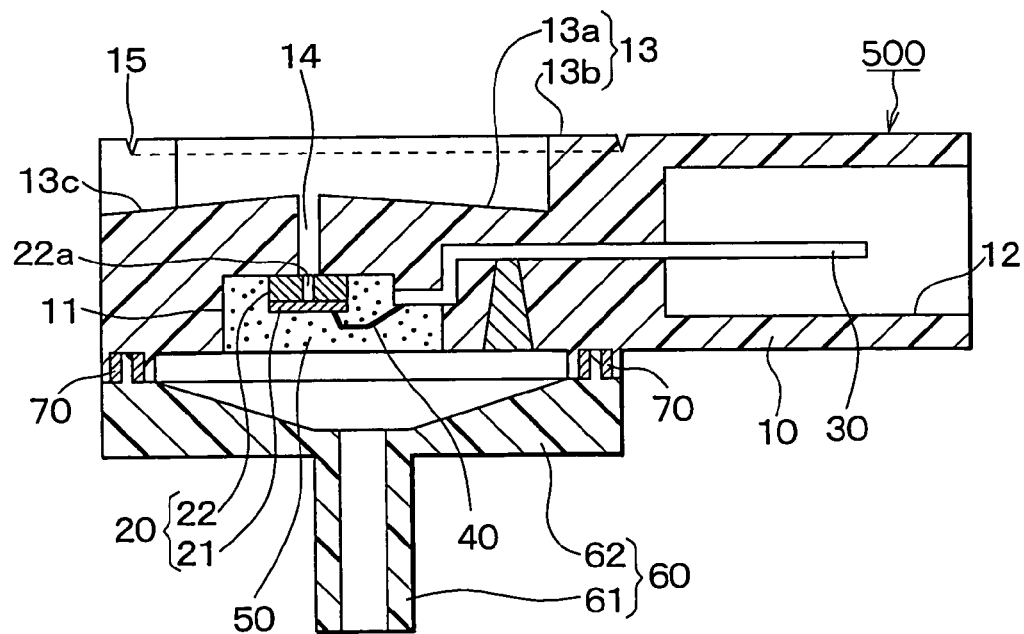
FIG. 8B is a cross sectional view showing the sensor according to a fifth embodiment of the present invention.

A pressure sensor 500 according to a fifth embodiment of the present invention is shown in FIGS. 8A, and 8B. The sensor 500 includes the concavity 13a having a slanted bottom surface. The bottom surface of the concavity 13a is slanted from the atmosphere introduction port 14 to the periphery of the casing 10. Specifically, the bottom surface disposed around the atmosphere introduction port 14 is higher than the surface disposed on the periphery of the casing 10.

As shown in FIGS. 8A and 8B, the bottom surface at the atmosphere introduction port 14 is the highest. Therefore, the water drop easily moves from the atmosphere introduction port 14 to the periphery of the bottom surface. That is, the water drop leaves from the atmosphere introduction port 14 rapidly.

Modifications

Although the grooves 15 have a certain arrangement shown in FIGS. 1A, 1B, 4A, 4B, 5A, 5B, 7A, 7B, 8A and 8B, the grooves 15 can have another arrangement. Further, the grooves 15 can have another shape as long as the grooves 15 discharges the water drop W adhering around the atmosphere introduction port 14 to the outside of the casing 10.

Further, other parts of the sensor except for the groove 15 can be changeable so that the other parts have another shape or are exchanged to another part as long as the groove 15 discharges the water drop.

Such changes and modifications are to be understood as being within the scope of the present invention as defined by the appended claims.

What is claimed is:

1. A pressure sensor comprising:
a sensor chip for detecting pressure;
a casing for accommodating the sensor chip; and
an atmosphere introduction port for introducing an atmosphere pressure as a reference pressure into the sensor chip,
wherein the atmosphere introduction port is disposed on the casing,
wherein the casing includes a groove for discharging a water drop adhering around the atmosphere introduction port to an outside of the casing, and
wherein the casing further includes a notch portion for discharging the water drop that is gathered in the groove.

2. The sensor according to claim 1,
wherein the casing further includes a chamber for accommodating the sensor chip,
wherein the casing has a casing top, which faces atmosphere, and
wherein the atmosphere introduction port connect between the casing top and the chamber so that the atmosphere pressure is introduced into the chamber through the atmosphere introduction port.

3. The sensor according to claim 2,
wherein the casing top includes a periphery and a concavity having a bottom,
wherein the periphery of the casing top surrounds the concavity of the casing top,
wherein the atmosphere introduction port has an outer opening on the bottom of the concavity, and
wherein the groove is disposed on the periphery of the casing top.

4. The sensor according to claim 3,
wherein the periphery of the casing top is higher than the bottom of the concavity, and
wherein the periphery includes the notch portion having a bottom so that the bottom of the notch portion and the bottom of the concavity provide a same plane so as to discharge the water drop disposed on the bottoms.

5. The sensor according to claim 4,
wherein the groove includes first and second ends, and the notch portion includes first and second sides, and
wherein the first end of the groove is disposed on the first side of the notch portion, and the second end of the groove is disposed on the second side of the notch portion so that the groove surrounds the concavity of the casing top 13 except for the notch portion.

6. The sensor according to claim 5,
wherein the water drop disposed on the periphery of the casing top is gathered into the groove so that the water drop is discharged from the groove through the notch portion to the outside of the sensor, and
wherein the water drop disposed on the bottom of the concavity is discharged from the notch portion to the outside of the sensor.

7. The sensor according to claim 6,
wherein the bottom of the concavity is slanted so that the bottom of the concavity disposed around the outer opening of the atmosphere introduction port is the highest.

8. The sensor according to claim 1,
wherein the groove has a predetermined cross section, which is determined such that the water drop disposed in the groove is movable by capillary phenomenon, and
wherein the cross section of the groove has a V-shape, a U-shape or a square shape.

9. The sensor according to claim 8,
wherein the casing is made of resin, and
wherein the sensor is mounted in an engine compartment of a vehicle so that the sensor detects an intake manifold pressure.

10. The sensor according to claim 9,
wherein the casing top faces a sky so that the casing top is exposed to the atmosphere in a case where the sensor is mounted in the engine compartment.

11. The sensor according to claim 1,
wherein the casing further includes a cover for covering the atmosphere introduction port.

12. A pressure sensor comprising:
a sensor chip for detecting pressure;
a casing for accommodating the sensor chip; and
an atmosphere introduction port for introducing an atmosphere pressure as a reference pressure into the sensor chip,
wherein the atmosphere introduction port is disposed on the casing,
wherein the casing includes a groove for discharging a water drop adhering around the atmosphere introduction port to an outside of the casing, and the casing further includes a chamber for accommodating the sensor chip,
wherein the casing has a casing top, which faces atmosphere, and the casing top includes a periphery and a concavity having a bottom, the periphery of the casing top surrounding the concavity of the casing top, the groove being disposed on the periphery of the casing top, the periphery of the casing top being higher than the bottom of the concavity,
wherein the atmosphere introduction port connects between the casing top and the chamber so that the atmosphere pressure is introduced into the chamber through the atmosphere introduction port, the atmosphere introduction port having an outer opening on the bottom of the concavity, and
wherein the periphery includes a notch portion having a bottom so that the bottom of the notch portion and the bottom of the concavity provide a same plane so as to discharge the water drop disposed on the bottoms.

13. The sensor according to claim 12,
wherein the groove includes first and second ends, and the notch portion includes first and second sides, and
wherein the first end of the groove is disposed on the first side of the notch portion, and the second end of the groove is disposed on the second side of the notch portion so that the groove surrounds, the concavity of the casing top 13 except for the notch portion.

14. The sensor according to claim 13,
wherein the water drop disposed on the periphery of the casing top is gathered into the groove so that the water drop is discharged from the groove through the notch portion to the outside of the sensor, and
wherein the water drop disposed on the bottom of the concavity is discharged from the notch portion to the outside of the sensor.

15. The sensor according to claim 14,
wherein the bottom of the concavity is slanted so that the bottom of the concavity disposed around the outer opening of the atmosphere introduction port is the highest.

* * * * *